United States Patent
Gao et al.

(10) Patent No.: US 10,772,217 B1
(45) Date of Patent: Sep. 8, 2020

(54) CIRCUIT BOARD AND METHOD FOR MANUFACTURING THE SAME

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Lin-Jie Gao, Shenzhen (CN); Han-Pei Huang, Hsinchu (TW)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/555,082

(22) Filed: Aug. 29, 2019

(30) Foreign Application Priority Data

Jun. 28, 2019 (CN) .......................... 2019 1 0577717

(51) Int. Cl.
| | |
|---|---|
| *H05K 3/46* | (2006.01) |
| *H05K 1/11* | (2006.01) |
| *H05K 3/40* | (2006.01) |
| *H05K 1/02* | (2006.01) |
| *H05K 1/18* | (2006.01) |

(52) U.S. Cl.
CPC ......... *H05K 3/4623* (2013.01); *H05K 1/0206* (2013.01); *H05K 1/112* (2013.01); *H05K 3/4038* (2013.01); *H05K 3/4614* (2013.01); *H05K 1/187* (2013.01); *H05K 2201/094* (2013.01); *H05K 2201/09854* (2013.01)

(58) Field of Classification Search
CPC .............. B29C 35/041; B29C 35/0227; B29C 35/0288; B29C 39/42; B29C 70/00; B29C 70/72; H02K 5/10; H02K 15/12; H05K 1/00; Y10T 29/49146; B29L 2031/3425; B60T 8/1703; B60T 13/74
USPC .......................................................... 174/251
See application file for complete search history.

(56) References Cited

U.S. PATENT DOCUMENTS

| | | | |
|---|---|---|---|
| 8,217,511 B2 * | 7/2012 | Tracht ................ | H01L 21/6835 257/693 |
| 2008/0024998 A1 * | 1/2008 | Hsu .................... | H01L 23/5389 361/719 |
| 2009/0032933 A1 * | 2/2009 | Tracht ................ | H01L 23/5389 257/693 |

(Continued)

*Primary Examiner* — Timothy J Thompson
*Assistant Examiner* — Michael F McAllister
(74) *Attorney, Agent, or Firm* — ScienBiziP, P.C.

(57) ABSTRACT

A circuit board includes a circuit substrate, a heat dissipation dielectric film and a ground circuit board stacked orderly. At least one conductive structure passes through the heat dissipation dielectric film to electrically connect the circuit substrate and the ground circuit board. An insulating layer is disposed on a side of the circuit substrate facing away from the heat dissipation dielectric film. The circuit board further includes at least one connecting unit. Each connecting unit passes through the insulating layer to be electrically connected to the circuit substrate. A height of each connecting unit is gradually increased from a center of the connecting unit to a periphery of the connecting unit. A method for manufacturing a circuit board is provided.

20 Claims, 5 Drawing Sheets

(56) References Cited

U.S. PATENT DOCUMENTS

2012/0252169 A1* 10/2012 Tracht ................. H01L 23/5389
                                                    438/124
2019/0297719 A1* 9/2019 Leitgeb .................. H05K 3/429

* cited by examiner

CIRCUIT BOARD AND METHOD FOR MANUFACTURING THE SAME

FIELD

The subject matter herein generally relates to a circuit board and a method for manufacturing the circuit board.

BACKGROUND

As the number of the electronic components in the circuit board increases, and the number of antennas increases, heat generated of the circuit board during operation will also increase. A circuit board that can withstand high heat is therefore desired.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 1:
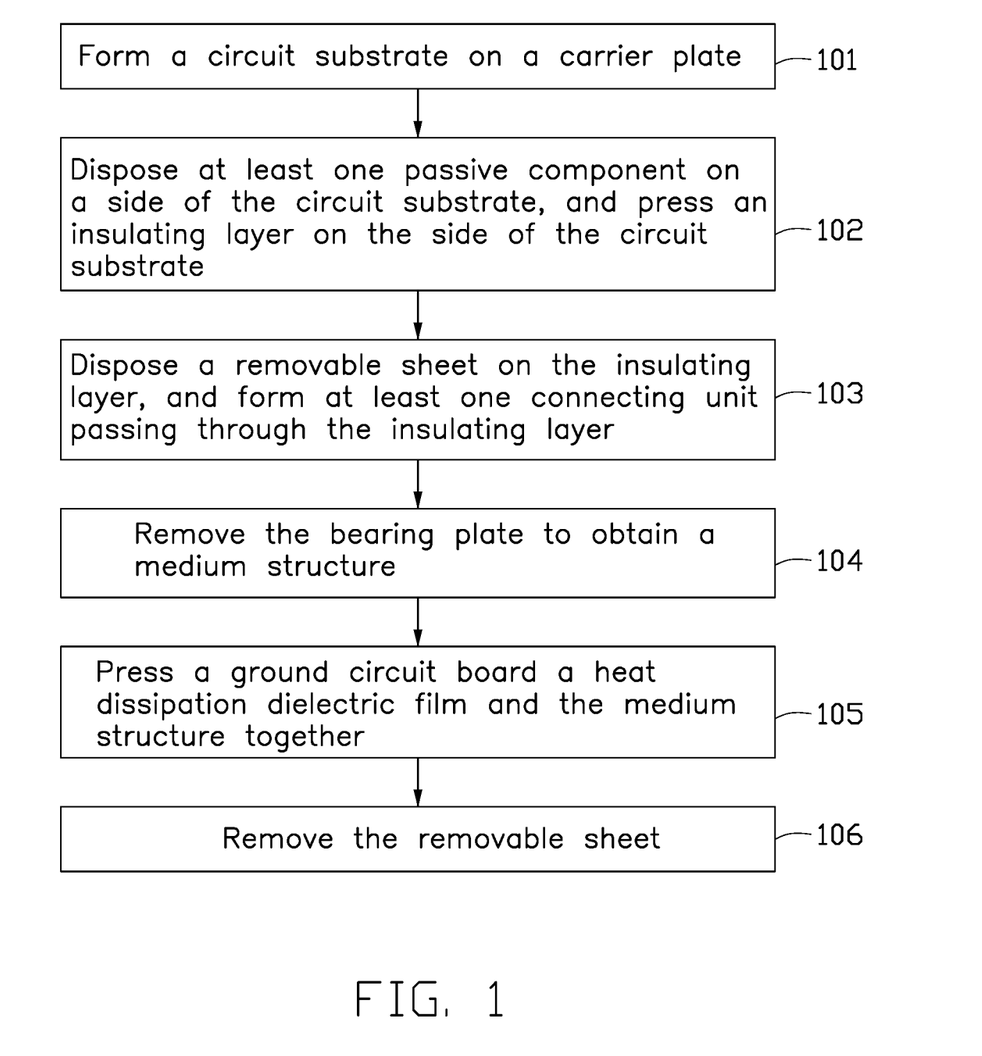
FIG. 1 is a flowchart of an embodiment of a method for manufacturing a circuit board.

FIG. 1 illustrates a flowchart of a method in accordance with an embodiment. The method for manufacturing a circuit board 100 (shown in FIG. 7) is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 101.

Figure 2:
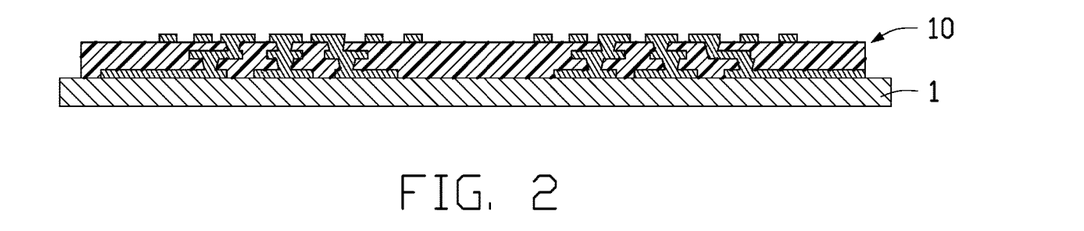
FIG. 2 is a cross-sectional view showing a circuit substrate on a carrier plate.

At block 101, referring to FIG. 2, a carrier plate 1 is provided, and a circuit substrate 10 is formed on the carrier plate 1.

Figure 3:
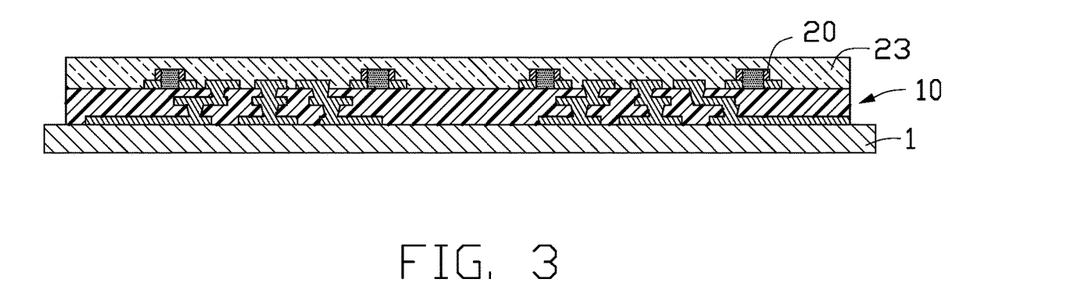
FIG. 3 is a cross-sectional view showing an insulating layer on the circuit substrate of FIG. 2.

At block 102, referring to FIG. 3, at least one passive component 20 is disposed on a side of the circuit substrate 10 facing away from the carrier plate 1, and an insulating layer 23 is pressed on the side of the circuit substrate 10 facing away from the carrier plate 1. So that the passive component 20 is buried in the insulating layer 23.

In at least one embodiment, the insulating layer 23 may be transparent. For example, the insulating layer 23 may be a polymer film made of a material selected from polyethylene terephthalate (PET), polyethylene naphthalate (PEN), polycarbonate (PC), polyether-ether-ketone (PEEK), polyether-sulfone (PES), polyarylester (PAR), polyimide (PI), poly (methyl methacrylate) (PMMA), polycyclic olefins (PCO), cellulose triacetate (TAC), polyurethane (PU), and any combination thereof.

Figure 4:
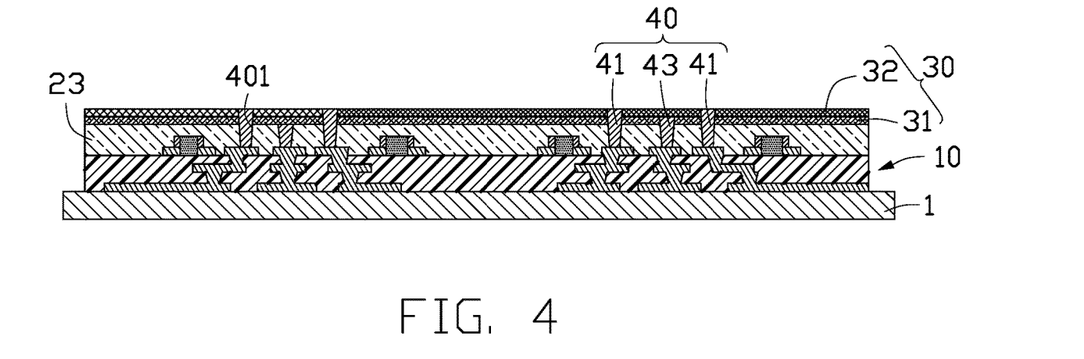
FIG. 4 is cross-sectional views showing a removable sheet on the insulating layer and at least one connecting unit passing through the insulating layer of FIG. 3.

At block 103, referring to FIG. 4, a removable sheet 30 is disposed on a side of the insulating layer 23 facing away from the circuit substrate 10, and at least one connecting unit 40 passes through the insulating layer 23 to be electrically connected to the circuit substrate 10. A height of each connecting unit 40 is gradually increased from a center of the connecting unit 40 to a periphery of the connecting unit 40.

Specifically, each connecting unit 40 includes a plurality of spaced connecting pads. A height of the plurality of connecting pads adjacent to the center of the connecting unit 40 is lower than a height of the plurality of spaced connecting pads adjacent to the periphery of the connecting unit 40.

In at least one embodiment, each connecting unit 40 includes two first connecting pads 41 and a second connecting pad 43. The first connecting pads 41 and the second connecting pad 43 are spaced. The second connecting pad 43 is positioned between the first connecting pads 41. The height of the first connecting pad 41 is higher than the height of the second connecting pad 43.

In at least one embodiment, the removable sheet 30 includes a first removable layer 31 and a second removable layer 32. The first removable layer 31 is disposed on a side of the insulating layer 23 facing away from the circuit substrate 10. The second removable layer 32 is disposed on a side of the first removable layer 31 facing away from the insulating layer 23. The plurality of connecting pads have different heights due to passing through a different number of removable layers.

The first connecting pad 41 passes through the insulating layer 23, the first removable layer 31 and the second removable layer 32 to be electrically connected to the circuit substrate 10. The second connecting pad 43 passes through the insulating layer 23, or passes through the insulating layer 23 and the first removable layer 31 to be electrically connected to the circuit substrate 10.

In another embodiment, the number of the connecting pads included in each connecting unit 40 and the number of the removable layers included in the removable sheet 30 can be varied as needed.

In at least one embodiment, a plurality connecting holes passing through the insulating layer 23 or passing through the insulating layer 23 and at least a portion of the removable sheet 30 are defined, and is infilled with conductive materials to form the connecting unit 40.

In at least one embodiment, the conductive materials may be polymer conductive materials to prevent from being oxidized, thereby facilitating the storage and transportation of the circuit board.

Figure 5:
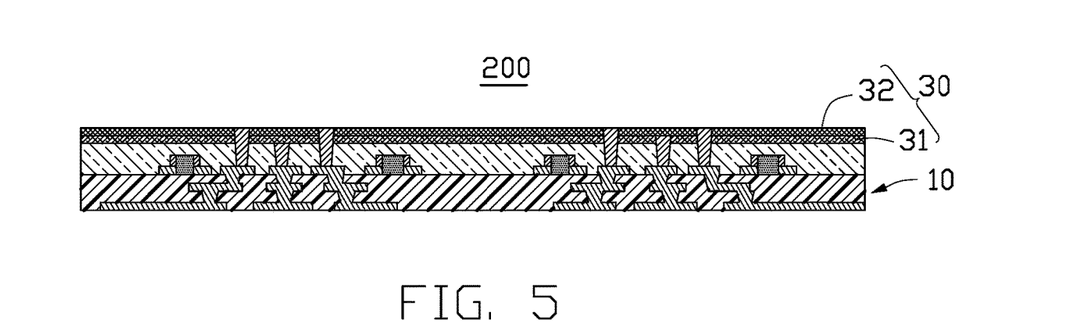
FIG. 5 is a cross-sectional view showing the carrier plate removed from the circuit substrate of FIG. 4 to form a medium structure.

At block 104, referring to FIG. 5, the carrier plate 1 is removed to obtain a medium structure 200.

Figure 6:
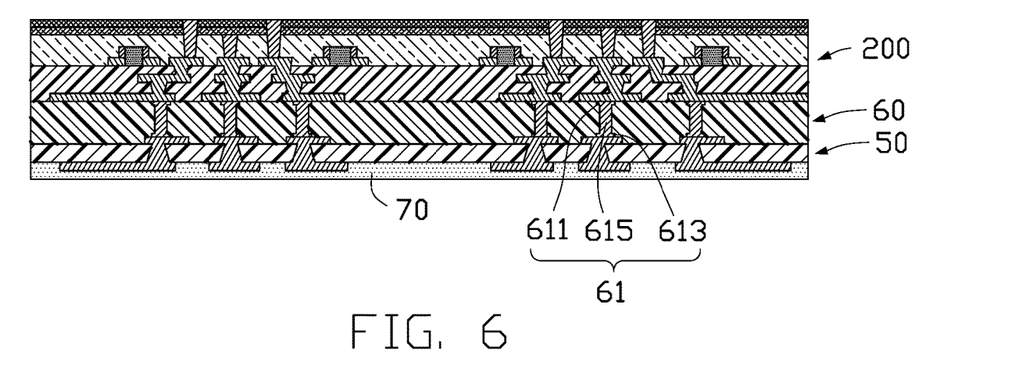
FIG. 6 is a cross-sectional view showing a ground circuit board a heat dissipation dielectric film and the medium structure of FIG. 5 pressed together.

At block 105, referring to FIG. 6, a ground circuit board 50, a heat dissipation dielectric film 60 and the medium structure 200 are stacked orderly and pressed together. At least one conductive structure 61 passes through the heat dissipation dielectric film 60 to electrically connect a side of the circuit substrate 10 facing away from the insulating layer 23 and the ground circuit board 50.

In at least one embodiment, the heat dissipation dielectric film 60 may be made of a heat dissipation material which is lightweight, has a high emissivity (low emissivity is difficult to achieve heat radiation) and excellent heat dissipation characteristics. The heat dissipation material includes a high thermal conductivity material and a resin material. When the high thermal conductivity material has a mass percentage of 40% to 50% of a total mass of the heat dissipation material, the heat dissipation material has both heat dissipation and cohesiveness. The high thermal conductivity material used in the present invention is not particularly limited and known in the art. Wherein the high thermal conductivity material having a thermal conductivity of 10 W/mK to 1000 W/Mk is preferable. For example, the high thermal conductivity material may be selected from silica, graphite, alumina, aluminum hydroxide, aluminum nitride, silicon carbide, magnesium hydroxide, and any combination thereof. The resin material is preferably a thermoplastic resin or a thermosetting resin. The thermoplastic resin may be selected from polyethylene, polypropylene, polymethylpentene, polybutene, crystalline polybutadiene, polystyrene, polybutadiene, styrene butadiene resin, chlorinated polyethylene, polyvinyl acetate, vinylidene chloride, ethylene-vinyl acetate copolymer (EVA), acrylonitrile-styrene copolymer (AS), acrylonitrile-butadiene-styrene copolymer (ABS), ionic polymer, acrylate-acrylonitrile-styrene copolymer (AAS), acrylonitrile-chlori-nalrd polyelhylen copolymer (AC S), polymethyl methacrylate, polymethacrylate, polytetrafluoroethylene, ethylene-tetra-fluoro-ethylene copolymer, polyacetal (polyoxymethylene), polyamide, polycarbonate, polyphenyleneether, polyethylene terephthalate, polybutylene terephthalate, polyacrylate, polystyrene, polyethersulfone, polyimide, polyamideimide, polyphenylene sulfide, polyoxybenzoyl, polyetheretherketone, polyetherimide, and any combination thereof. The thermosetting resin may be selected from a phenol resin, a thermosetting resin containing a dihydrobenzoxazine ring polymerized by ring-opening polymerization, an amine resin (such as urea resin, melamine resin, or benzoguanamine resin), an unsaturated polyester resin, a o-benzenedicarboxylic acid diallyl ester, an alkyd resin, an epoxy resin, polyurethane resin, silicone, and any combination thereof. The phenol resin, the thermosetting resin containing a dihydrobenzoxazine ring polymerized by ring-opening polymerization and the epoxy resin are preferable in view of factors such as heat resistance, moldability, and easy to separate from the metal mold.

Each conductive structure 61 includes a first end portion 611, a connecting portion 615 and a second end portion 613 which are sequentially disposed along a thickness direction of the heat dissipation dielectric film 60. The connecting portion 615 connects the first end portion 611 and the second end portion 613. A projection area of the first end portion 611 and a projection area of the second end portion 613 along the thickness direction of the heat dissipation dielectric film 60 are respectively greater than a projection area of the connecting portion 615. As a result, each conductive structure 61 is substantially H-shaped. So that a contact area between the conductive structure 61 and the circuit substrate 10 and a contact area between the conductive structure 61 and ground circuit board 50 are increased, thereby preventing the conductive structure 61 from being easily separated from the circuit substrate 10 and the ground circuit board 50 when the circuit board generates heat.

In at least one embodiment, the connecting portion 615 may be a connecting post with a uniform diameter. In another embodiment, the diameter of the connecting portion 615 may gradually increase from a center of the connecting portion 615 to the first end portion 611 and the second end portion 613 along the thickness direction of the heat dissipation dielectric film 60, respectively.

Figure 7:
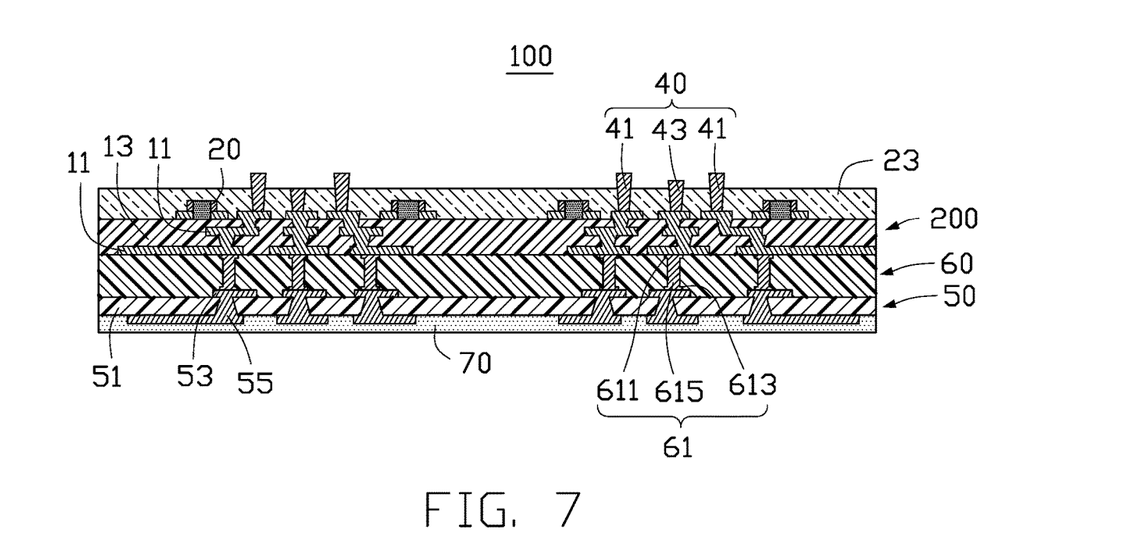
FIG. 7 is a cross-sectional view of an embodiment of a circuit board.

At block 106, referring to FIG. 7, the removable sheet 30 is removed to obtain a circuit board 100. The first connecting pad 41 protrudes from the side of the insulating layer 23 facing away from the circuit substrate 10. The second connecting pad 43 is flush with or protrudes from the side of the insulating layer 23 facing away from the circuit substrate 10. A height of the second connecting pad 43 protruding from the insulating layer 23 is less than a height of the first connecting pad 41 protruding from the insulating layer 23.

The first connecting pad 41 and the second connecting pad 43 are used to connect an active component (not shown). Since the height of each connecting unit 40 is gradually increased from the center of the connecting unit 40 to the periphery of the connecting unit 40, thereby avoiding an electrical connection failure between the connecting unit 40 and the active component, and avoiding affecting a heat dissipation of the active component along the connecting unit 40, caused a detachment of the periphery of the connecting unit 40 from active component when the circuit board is warped.

In at least one embodiment, after block 105 and before block 106, the method may further include a step of forming a protective layer 70 (shown in FIG. 6) on a side of the ground circuit board 50 facing away from the heat dissipation dielectric film 60. In another embodiment, the protective layer 70 may be formed after block 106.

Figure 8:
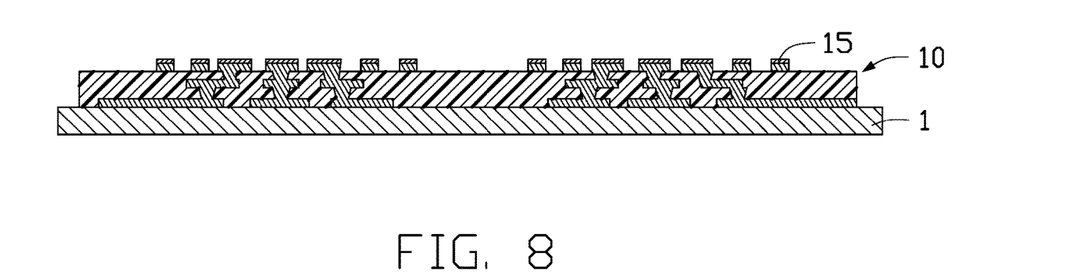
FIG. 8 is a cross-sectional view of another embodiment showing a circuit substrate on a carrier plate.

Preferably, in at least one embodiment, before block 102, the method may further include a step of subjecting an outermost surface of a wiring layer of the circuit substrate 10 facing away from the carrier plate 1 to an oxide treatment to form an oxidation film 15 (shown in FIG. 8). The oxidation film 15 increases a surface roughness of the surface of the wiring layer of the circuit substrate 10 facing away from the carrier plate 1, thereby improving a blinding force between the wiring layer and the subsequently formed connecting unit 40.

In at least one embodiment, the circuit substrate 10 includes at least two wiring layers 11 and at least one dielectric layer 13. The dielectric layer 13 may be a common dielectric material such as polyimide. A thickness of the heat dissipation dielectric film 60 is greater than a thickness of the dielectric layer 13 adjacent to the heat dissipation dielectric film 60. Preferably, the thickness of the heat dissipation dielectric film 60 is twice the thickness of the dielectric layer 13 adjacent to the heat dissipation dielectric film 60.

In at least one embodiment, the ground circuit board 50 may be formed by etching a double-sided copper clad laminate. Specifically, the ground circuit board 50 includes an insulating film 51, a first ground layer 53 and a second ground layer 55. The first ground layer 53 and the second ground layer 55 are respectively disposed on opposite sides of the insulating film 51. When the ground circuit board 50, the heat dissipation dielectric film 60 and the medium structure 200 are pressed together, a side of the ground circuit board 50 with the first ground layer 53 is coupled to the heat dissipation dielectric film 60. The second ground layer 55 is a large-area heat dissipation structure to improve heat dissipation efficiency. In the illustrated embodiment, an area of the second ground layer 55 is greater than an area of the first ground layer 53. In another embodiment, the second ground layer 55 may be a fin structure to improve heat dissipation efficiency.

Figure 9:
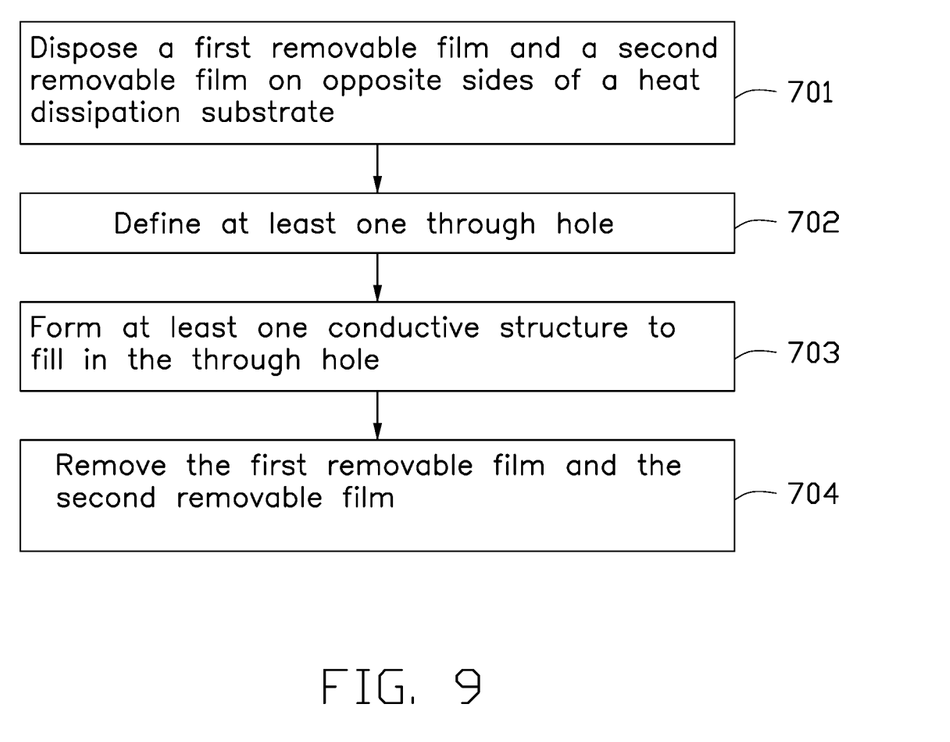
FIG. 9 is a flowchart of an embodiment of a method for manufacturing a heat dissipation dielectric film.

FIG. 9 illustrates a flowchart of an embodiment of a method for manufacturing the heat dissipation dielectric film 60. The method can begin at block 701.

Figure 10:
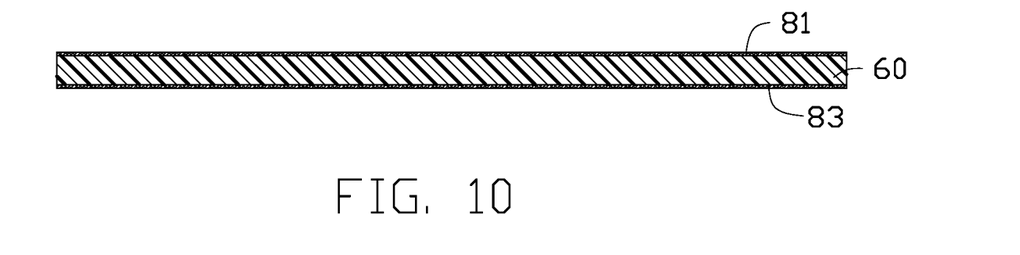
FIG. 10 is a cross-sectional view showing a first removable film and a second removable film on a heat dissipation substrate.

At block 701, referring to FIG. 10, a first removable film 81 and a second removable film 83 are respectively disposed on opposite sides of a heat dissipation substrate 60'.

Figure 11:
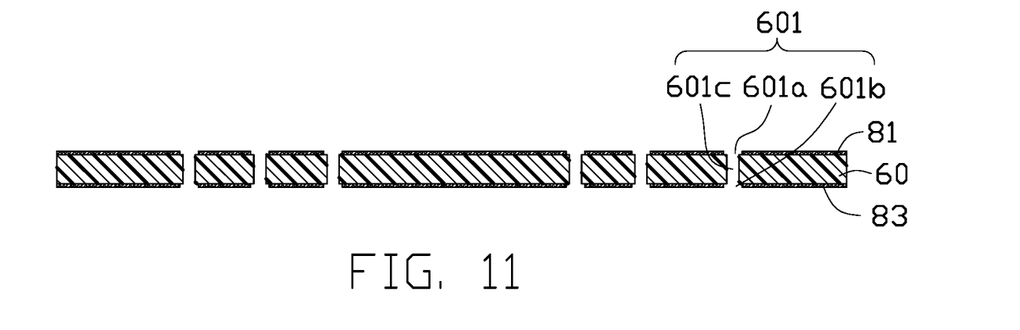
FIG. 11 is a cross-sectional view showing at least one through hole passing through the first removable film, the second removable film and the heat dissipation substrate of FIG. 10.

At block 702, referring to FIG. 11, at least one through hole 601 passing through the first removable film 81, the heat dissipation substrate 60' and the second removable film 83 is defined.

The through hole 601 may be defined by laser or mechanical drilling.

In at least one embodiment, each through hole 601 includes a first portion 601a, a second portion 601b, and a third portion 601c. The first portion 601a passes through the first removable film 81, the second portion 601b passes through the second removable film 83, and the third portion 601c passes through the heat dissipation substrate 60'. The third portion 601c communicates with the first portion 601a and the second portion 601b. An aperture of the first portion 601a and an aperture of the second portion 601b are respectively greater than an aperture of the third portion 601c. So that each through hole 601 is H-shaped. In at least one embodiment, the through hole 601 may be a straight-through hole. In at least one embodiment, an aperture of the third portion 601c increases from a center of the third portion 601c to the first portion 601a and the second portion 601b, respectively.

Figure 12:
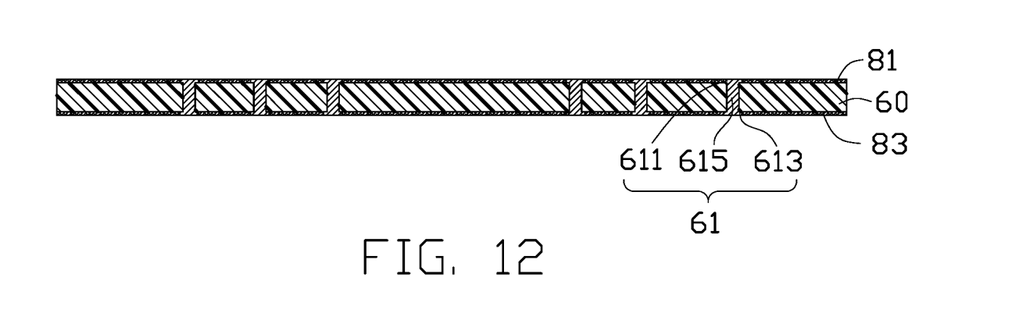
FIG. 12 is a cross-sectional view showing at least one conductive structure in the through hole of FIG. 11.

At block 703, referring to FIG. 12, at least one conductive structure 61 is formed by filling conductive materials in the through hole 601. Each conductive structure 61 includes a first end portion 611 corresponding to the first portion 601a, a second end portion 613 corresponding to the second portion 601b, and a connecting portion 615 corresponding to the third portion 601c.

Figure 13:
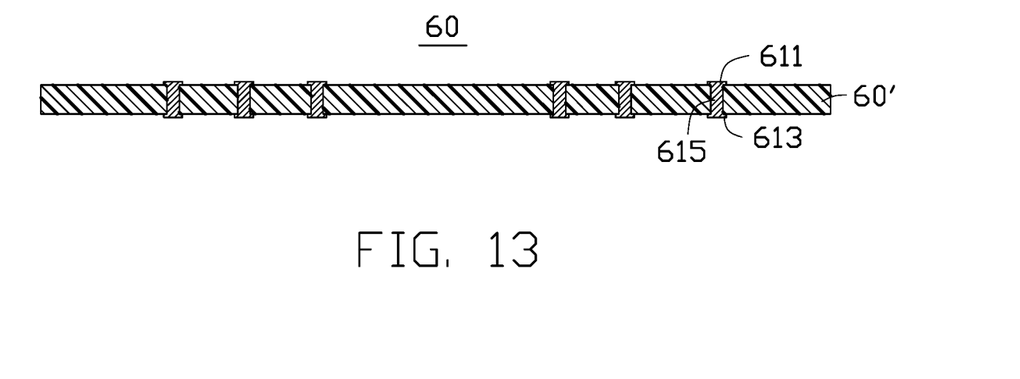
FIG. 13 is a cross-sectional view of an embodiment of a heat dissipation dielectric film.

At block 704, referring to FIG. 13, the first removable film 81 and the second removable film 83 are removed to obtain the heat dissipation dielectric film 60. The first end portion 611 and the second end portion 613 protrude from the opposite sides of the heat dissipation substrate 60'.

Depending on the embodiment, certain of the steps of methods described may be removed, others may be added, and the sequence of steps may be altered. It is also to be understood that the description and the claims drawn to a method may include some indication in reference to sequential steps. However, the indication used is only to be viewed for identification purposes and not as a suggestion as to an order for the steps.

FIG. 7 illustrates an embodiment of a circuit board 100. The circuit board 100 includes a circuit substrate 10, a heat dissipation dielectric film 60 and a ground circuit board 50 stacked orderly. At least one conductive structure 61 passes through the heat dissipation dielectric film 60 to electrically connect the circuit substrate 10 and the ground circuit board 50. An insulating layer 23 is disposed on a side of the circuit substrate 10 facing away from the heat dissipation dielectric film 60. The circuit board 100 further includes at least one connecting unit 40. Each connecting unit 40 passes through the insulating layer 23 to be electrically connected to the circuit substrate 10. A height of each connecting unit 40 is gradually increased from a center of the connecting unit 40 to a periphery of the connecting unit 40.

Specifically, each connecting unit 40 includes a plurality of spaced connecting pads. A height of the plurality of connecting pads adjacent to the center of the connecting unit 40 is lower than a height of the plurality of spaced connecting pads adjacent to the periphery of the connecting unit 40. At least one connecting pad protrudes from a side of the insulating layer 23 facing away from the circuit substrate 10.

In at least one embodiment, each connecting unit 40 includes two first connecting pads 41 and a second connecting pad 43. The first connecting pads 41 and the second connecting pad 43 are spaced. The second connecting pad 43 is positioned between the first connecting pads 41. The height of the first connecting pad 41 is higher than the height of the second connecting pad 43.

The first connecting pad 41 protrudes from the side of the insulating layer 23 facing away from the circuit substrate 10. The second connecting pad 43 is flush with or protrudes from the side of the insulating layer 23 facing away from the circuit substrate 10. A height of the second connecting pad 43 protruding from the insulating layer 23 is less than a height of the first connecting pad 41 protruding from the insulating layer 23.

The first connecting pad 41 and the second connecting pad 43 are used to connect an active component (not shown). Since the height of each connecting unit 40 is gradually increased from the center of the connecting unit 40 to the periphery of the connecting unit 40, thereby avoiding an electrical connection failure between the connecting unit 40 and the active component, and avoiding affecting a heat dissipation of the active component along the connecting unit 40, caused a detachment of the periphery of the connecting unit 40 from active component when the circuit board is warped.

In at least one embodiment, the connecting unit 40 may be made of polymer conductive materials to prevent from being oxidized, thereby facilitating the storage and transportation of the circuit board.

In at least one embodiment, the heat dissipation dielectric film 60 may be made of a heat dissipation material which is lightweight, has a high emissivity (low emissivity is difficult to achieve heat radiation) and excellent heat dissipation characteristics. The heat dissipation material includes a high thermal conductivity material and a resin material. When the high thermal conductivity material has a mass percentage of 40% to 50% of a total mass of the heat dissipation material, the heat dissipation material has both heat dissipation and cohesiveness. The high thermal conductivity material used in the present invention is not particularly limited and known in the art. Wherein the high thermal conductivity material having a thermal conductivity of 10 W/mK to 1000 W/Mk is preferable. For example, the high thermal conductivity material may be selected from silica, graphite, alumina, aluminum hydroxide, aluminum nitride, silicon carbide, magnesium hydroxide, and any combination thereof. The resin material is preferably a thermoplastic resin or a thermosetting resin. The thermoplastic resin may be selected from polyethylene, polypropylene, polymethylpentene, polybutene, crystalline polybutadiene, polystyrene, polybutadiene, styrene butadiene resin, chlorinated polyethylene, polyvinyl acetate, vinylidene chloride, ethylene-vinyl acetate copolymer (EVA), acrylonitrile-styrene copolymer (AS), acrylonitrile-butadiene-styrene copolymer (ABS), ionic polymer, acrylate-acrylonitrile-styrene copolymer (AAS), acrylonitrile-chlori-nalrd polyelhylen copolymer (ACS), polymethyl methacrylate, polymethacrylate, polytetrafluoroethylene, ethylene-tetra-fluoro-ethylene copolymer, polyacetal (polyoxymethylene), polyamide, polycarbonate, polyphenyleneether, polyethylene terephthalate, polybutylene terephthalate, polyacrylate, polystyrene, polyethersulfone, polyimide, polyamideimide, polyphenylene sulfide, polyoxybenzoyl, polyetheretherketone, polyetherimide, and any combination thereof. The thermosetting resin may be selected from a phenol resin, a thermosetting resin containing a dihydrobenzoxazine ring polymerized by ring-opening polymerization, an amine resin (such as urea resin, melamine resin, or benzoguanamine resin), an unsaturated polyester resin, a o-benzenedicarboxylic acid diallyl ester, an alkyd resin, an epoxy resin, polyurethane resin, silicone, and any combination thereof. The phenol resin, the thermosetting resin containing a dihydrobenzoxazine ring polymerized by ring-opening polymerization and the epoxy resin are preferable in view of factors such as heat resistance, moldability, and easy to separate from the metal mold.

Each conductive structure 61 includes a first end portion 611, a connecting portion 615 and a second end portion 613 which are sequentially disposed along a thickness direction of the heat dissipation dielectric film 60. The connecting portion 615 connects the first end portion 611 and the second end portion 613. A projection area of the first end portion 611 along the thickness direction of the heat dissipation dielectric film 60 are respectively greater than a projection area of the connecting portion 615. As a result, each conductive structure 61 is substantially H-shaped. So that a contact area between the conductive structure 61 and the circuit substrate 10 and a contact area between the conductive structure 61 and ground circuit board 50 are increased, thereby preventing the conductive structure 61 from being easily separated from the circuit substrate 10 and the ground circuit board 50 when the circuit board generates heat.

In at least one embodiment, the connecting portion 615 may be a connecting post with a uniform diameter. In another embodiment, the diameter of the connecting portion 615 may gradually increase from a center of the connecting portion 615 to the first end portion 611 and the second end portion 613 along the thickness direction of the heat dissipation dielectric film 60, respectively.

An oxidation film 15 (shown in FIG. 8) is formed on a surface of a wiring layer of the circuit substrate 10 facing away from the carrier plate 1. The oxidation film 15 connects the connecting unit 40 and the circuit substrate 10 to improve a blinding force between the wiring layer and the connecting unit 40.

In at least one embodiment, the insulating layer 23 may be transparent. For example, the insulating layer 23 may be a polymer film made of a material selected from polyethylene terephthalate (PET), polyethylene naphthalate (PEN), polycarbonate (PC), polyether-ether-ketone (PEEK), polyethersulfone (PES), polyarylester (PAR), polyimide (PI), poly (methyl methacrylate) (PMMA), polycyclic olefins (PCO), cellulose triacetate (TAC), polyurethane (PU), and any combination thereof. Since the insulating layer 23 is transparent, the oxidation film 15 can be exposed from the insulating layer 23 as an identification mark to facilitate to mount the active components.

The circuit board 100 may further include at least one passive component 20. The passive component 20 is buried in the insulating layer 23 and electrically connects with a side of the circuit substrate 10 facing away from the heat dissipation dielectric film 60.

The ground circuit board 50 may be formed by etching a double-sided copper clad laminate. Specifically, the ground circuit board 50 includes an insulating film 51, a first ground layer 53 and a second ground layer 55. The first ground layer 53 and the second ground layer 55 are respectively disposed on opposite sides of the insulating film 51. When the ground circuit board 50, the heat dissipation dielectric film 60 and the medium structure 200 are pressed together, a side of the ground circuit board 50 with the first ground layer 53 is coupled to the heat dissipation dielectric film 60. The second ground layer 55 is a large-area heat dissipation structure to improve heat dissipation efficiency. In another embodiment, the second ground layer 55 may be a fin structure to improve heat dissipation efficiency.

In at least one embodiment, the second ground layer 55 may connect with other heat dissipation element to improve the heat dissipation efficiency of the circuit board.

Since the height of each connecting unit 40 is gradually increased from the center of the connecting unit 40 to the periphery of the connecting unit 40, thereby avoiding an electrical connection failure between the connecting unit 40 and the active component, and avoiding affecting a heat dissipation of the active component along the connecting unit 40, caused a detachment of the periphery of the connecting unit 40 from active component when the circuit board is warped. In addition, the heat generated by the active component and the passive component 20 can be diffused by the heat dissipation dielectric film 60 after passing the circuit substrate 10, thereby avoiding excessive heat concentration. At the same time, the heat of the circuit substrate 10 can be quickly conducted to the ground circuit board 50 by the conductive structure 61 for heat dissipation.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board comprising:
   providing a carrier plate and forming a circuit substrate on the carrier plate;

pressing an insulating layer on a side of the circuit substrate facing away from the carrier plate;

disposing a removable sheet on a side of the insulating layer facing away from the circuit substrate, and forming at least one connecting unit passing through the insulating layer to be electrically connected to the circuit substrate, wherein a height of each of the at least one connecting unit is increased from a center of the connecting unit to a periphery of the connecting unit;

removing the carrier plate to obtain a medium structure;

stacking and pressing a ground circuit board, a heat dissipation dielectric film and the medium structure as ordered, wherein at least one conductive structure passes through the heat dissipation dielectric film to electrically connect a side of the circuit substrate facing away from the insulating layer and a side of the ground circuit board; and removing the removable sheet.

2. The method for manufacturing a circuit board of claim 1, wherein each of the at least one connecting unit comprises a plurality of spaced connecting pads, a height of the plurality of connecting pads adjacent to the center of the connecting unit is lower than a height of the plurality of spaced connecting pads adjacent to the periphery of the connecting unit.

3. The method for manufacturing a circuit board of claim 1, each of the at least one connecting unit comprises at least two first connecting pads and at least one second connecting pad, the first connecting pads and the second connecting pad are spaced apart, the second connecting pad is positioned between the first connecting pads, a height of the first connecting pad is higher than the height of the second connecting pad.

4. The method for manufacturing a circuit board of claim 3, wherein the removable sheet comprises a first removable layer and a second removable layer, the first removable layer is disposed on a side of the insulating layer facing away from the circuit substrate, the second removable layer is disposed on a side of the first removable layer facing away from the insulating layer; each of the first connecting pads passes through the insulating layer, the first removable layer and the second removable layer to be electrically connected to the circuit substrate; the second connecting pad passes through the insulating layer, or passes through the insulating layer and the first removable layer to be electrically connected to the circuit substrate.

5. The method for manufacturing a circuit board of claim 1, wherein the insulating layer is transparent.

6. The method for manufacturing a circuit board of claim 1, wherein before pressing the insulating layer on the side of the circuit substrate facing away from the carrier plate, the method further comprises forming an oxidation film on an outermost surface of a wiring layer of the circuit substrate facing away from the carrier plate by an oxide treatment; after forming the at least one connecting unit, the oxidation film connects the circuit substrate and the at least one connecting unit.

7. The method for manufacturing a circuit board of claim 1, wherein the ground circuit board comprises an insulating film, a first ground layer and a second ground layer, the first ground layer and the second ground layer are respectively disposed on opposite sides of the insulating film; after pressing the ground circuit board, the heat dissipation dielectric film and the medium structure, a side of the ground circuit board with the first ground layer is coupled to the heat dissipation dielectric film.

8. The method for manufacturing a circuit board of claim 7, wherein an area of the second ground layer is greater than an area of the first ground layer.

9. The method for manufacturing a circuit board of claim 1, wherein each of the at least one conductive structure comprises a first end portion, a connecting portion and a second end portion which are sequentially disposed along a thickness direction of the heat dissipation dielectric film; the connecting portion connects the first end portion and the second end portion, a projection area of the first end portion and a projection area of the second end portion along the thickness direction of the heat dissipation dielectric film are respectively greater than a projection area of the connecting portion.

10. The method for manufacturing a circuit board of claim 9, wherein a diameter of the connecting portion increases from a center of the connecting portion to the first end portion and the second end portion along the thickness direction of the heat dissipation dielectric film.

11. The method for manufacturing a circuit board of claim 9, wherein the heat dissipation dielectric film is formed by the following steps:

disposing a first removable film and a second removable film on opposite sides of a heat dissipation substrate;

defining at least one through hole passing through the first removable film, the heat dissipation substrate and the second removable film; wherein each of the at least one through hole comprises a first portion, a second portion and a third portion, the first portion passes through the first removable film, the second portion passes through the second removable film, and the third portion passes through the heat dissipation substrate; the third portion communicates with the first portion and the second portion, an aperture of the first portion and an aperture of the second portion are respectively greater than an aperture of the third portion;

filling conductive materials in the at least one through hole to form at least one conductive structure; and removing the first removable film and the second removable film to obtain the heat dissipation dielectric film.

12. A circuit board comprising:

a circuit substrate;
a heat dissipation dielectric film;
a ground circuit board; and
at least one connecting unit;
wherein the circuit substrate, the heat dissipation dielectric film and ground circuit board are stacked orderly; at least one conductive structure passes through the heat dissipation dielectric film to electrically connect the circuit substrate and the ground circuit board; an insulating layer is disposed on a side of the circuit substrate facing away from the heat dissipation dielectric film; each of the connecting unit passes through the insulating layer to be electrically connected to the circuit substrate, a height of each connecting unit is gradually increased from a center of the connecting unit to a periphery of the connecting unit.

13. The circuit board of claim 12, wherein each of the at least one connecting unit comprises a plurality of spaced connecting pads, a height of the plurality of connecting pads adjacent to the center of the connecting unit is lower than a height of the plurality of spaced connecting pads adjacent to the periphery of the connecting unit.

14. The circuit board of claim 13, wherein each of the at least one connecting unit comprises at least two first connecting pads and at least one second connecting pad, the first connecting pads and the second connecting pad are spaced apart, the second connecting pad is positioned between the first connecting pads, a height of the first connecting pad is higher than the height of the second connecting pad; each of the first connecting pads protrudes from the side of the insulating layer facing away from the circuit substrate, the second connecting pad is flush with or protrudes from the side of the insulating layer facing away from the circuit substrate, a height of the second connecting pad protruding from the insulating layer is less than a height of the first connecting pad protruding from the insulating layer.

15. The circuit board of claim 12, wherein the insulating layer is transparent.

16. The circuit board of claim 12, wherein the circuit board further comprises an oxidation film connecting the circuit substrate and the at least one connecting unit.

17. The circuit board of claim 12, wherein the ground circuit board comprises an insulating film, a first ground layer and a second ground layer, the first ground layer and the second ground layer are respectively disposed on opposite sides of the insulating film, a side of the ground circuit board with the first ground layer is coupled to the heat dissipation dielectric film.

18. The circuit board of claim 17, wherein an area of the second ground layer is greater than an area of the first ground layer.

19. The circuit board of claim 12, wherein each of the at least one conductive structure comprises a first end portion, a connecting portion and a second end portion which are sequentially disposed along a thickness direction of the heat dissipation dielectric film; the connecting portion connects the first end portion and the second end portion, a projection area of the first end portion and a projection area of the second end portion along the thickness direction of the heat dissipation dielectric film are respectively greater than a projection area of the connecting portion.

20. The circuit board of claim 19, wherein a diameter of the connecting portion increases from a center of the connecting portion to the first end portion and the second end portion along the thickness direction of the heat dissipation dielectric film.

* * * * *